US012683601B2

(12) United States Patent
Palomeque

(10) Patent No.: US 12,683,601 B2
(45) Date of Patent: Jul. 14, 2026

(54) CAPACITOR CURRENT-LEAKAGE COMPENSATION CIRCUIT

(71) Applicant: QUALCOMM Incorporated, San Diego, CA (US)

(72) Inventor: David Palomeque, Cork (IE)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/884,883

(22) Filed: Sep. 13, 2024

(65) Prior Publication Data

US 2026/0081591 A1    Mar. 19, 2026

(51) Int. Cl.
     *H03K 17/16*          (2006.01)
(52) U.S. Cl.
     CPC .................................. *H03K 17/161* (2013.01)
(58) Field of Classification Search
     CPC .... H03K 17/16; H03K 17/161; H03K 17/162; G05F 1/10; G05F 1/625; G05F 3/02
     USPC .................................................. 327/378, 382
     See application file for complete search history.

(56) References Cited

U.S. PATENT DOCUMENTS 6,194,967 B1    2/2001  Johnson et al.
6,744,303 B1 *  6/2004  Maley ........................ G05F 1/46
                                                        327/543

11,340,639 B2 *  5/2022  Stadlmair .............. G01R 27/14
12,375,076 B2 *  7/2025  Lee ......................... H03K 17/16
2006/0097759 A1  5/2006  Omori et al.
2015/0236014 A1  8/2015  Gathman

OTHER PUBLICATIONS

Chang J-Y., et al., "A Phase-Locked Loop With Background Leakage Current Compensation", IEEE Transactions on Circuits and Systems li: Express Briefs, IEEE, USA, vol. 57, No. 9, Sep. 1, 2010, pp. 666-670, XP011316887, abstract; figures 1,2.
International Search Report and Written Opinion—PCT/US2025/044312—ISA/EPO—Dec. 19, 2025.

* cited by examiner

*Primary Examiner* — Hai L Nguyen

(74) *Attorney, Agent, or Firm* — Loza & Loza, LLP

(57)                    ABSTRACT

An integrated circuit (IC), including: a metal-oxide-semiconductor (MOS) capacitor coupled between a first voltage rail and a node, wherein the MOS capacitor generates a leakage current while in operation, the leakage current flowing between the first voltage rail and the node; and a capacitor leakage-current compensation circuit coupled between the node and a second voltage rail, wherein the capacitor leakage-current compensation circuit is configured to generate a compensation current flowing between the node and the second voltage rail, the compensation current flowing in the same direction as the leakage current between the first voltage rail and the second voltage rail.

19 Claims, 5 Drawing Sheets

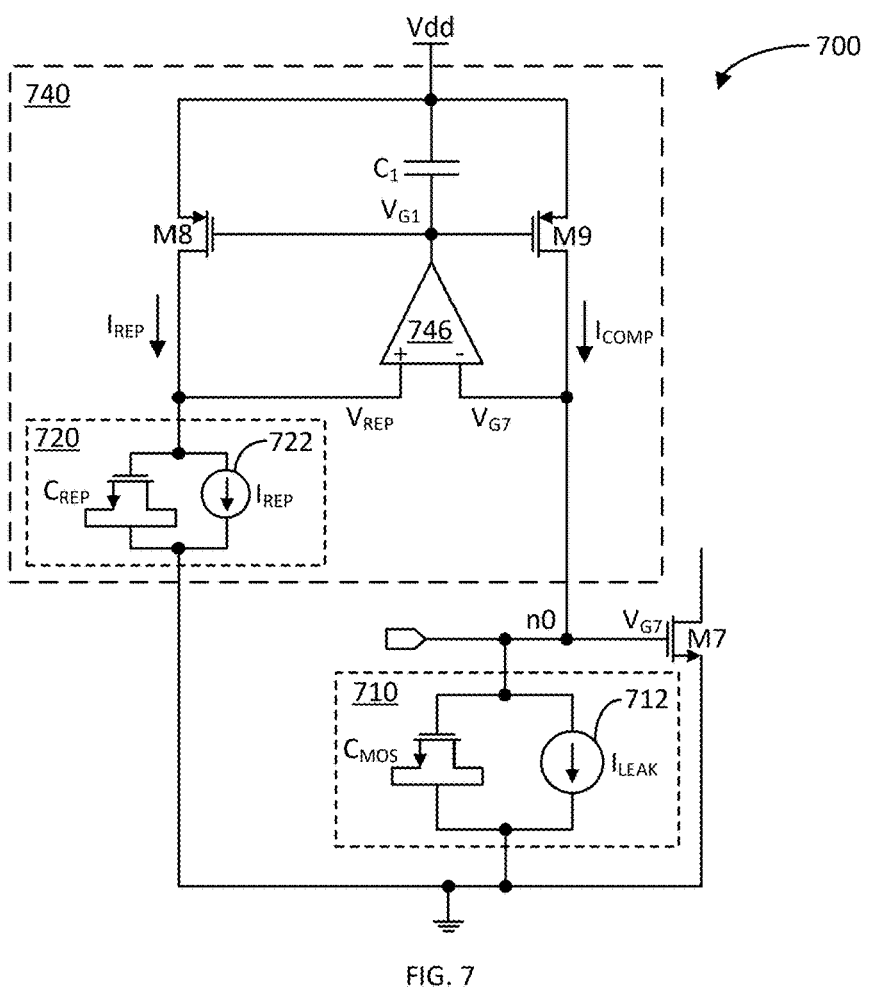
FIG. 7
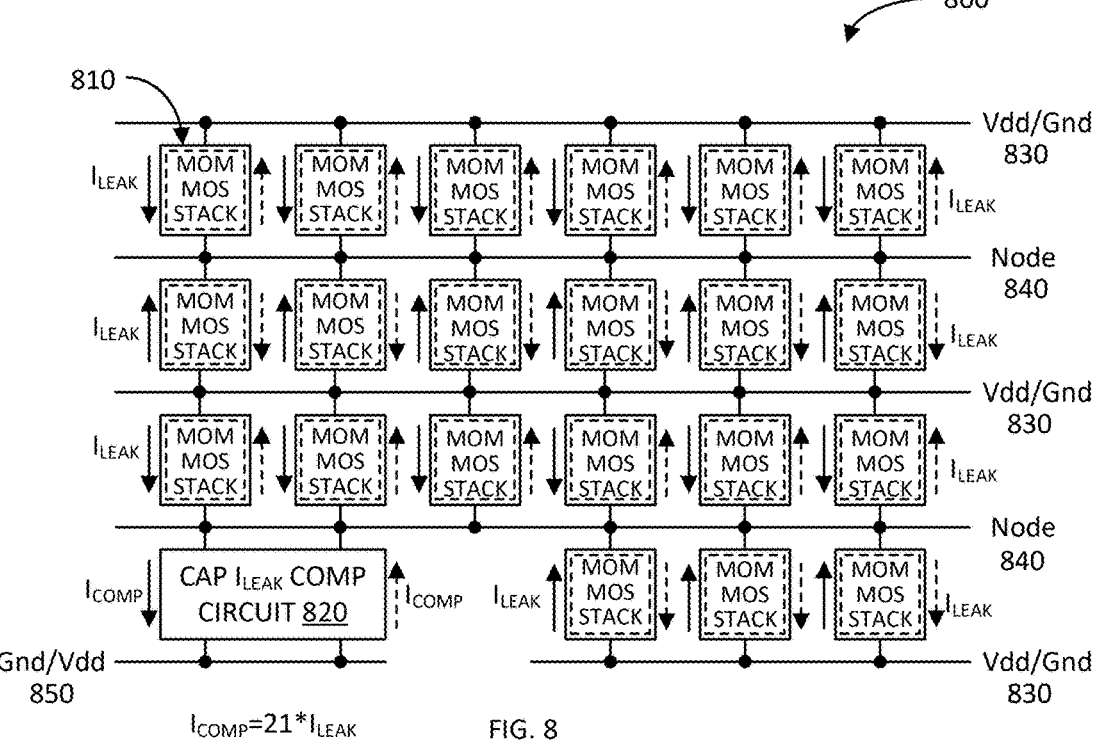
$I_{COMP}=21*I_{LEAK}$     FIG. 8

CAPACITOR CURRENT-LEAKAGE COMPENSATION CIRCUIT

FIELD

This disclosure relates generally to capacitor current leakage, and in particular, to a capacitor current-leakage compensation circuit.

BACKGROUND

Many integrated circuits (ICs) include circuits that require relatively high capacitance. For example, such circuits may include low pass filters (LPF), such as resistor-capacitor (RC) filters, which require a relatively high time constant or low cutoff frequency. In such case, a relatively large capacitor or capacitance may be required. To realize such large capacitance in an area efficient manner in ICs, capacitors may be implemented as metal-oxide-metal (MOM) capacitors stacked over metal-oxide-semiconductor (MOS) capacitors, respectively. In certain technology nodes, the MOS capacitors may exhibit relatively large leakage current, which may adversely impact circuit operation.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC). The IC includes: a metal-oxide-semiconductor (MOS) capacitor coupled between a first voltage rail and a node, wherein the MOS capacitor generates a leakage current while in operation, the leakage current flowing between the first voltage rail and the node; and a capacitor leakage-current compensation circuit coupled between the node and a second voltage rail, wherein the capacitor leakage-current compensation circuit is configured to generate a compensation current flowing between the node and the second voltage rail, the compensation current flowing in the same direction as the leakage current between the first voltage rail and the second voltage rail.

Another aspect of the disclosure relates to a method. The method includes: generating a leakage current from a metal-oxide-semiconductor (MOS) capacitor, wherein the leakage current flows between a first voltage rail and a node; and generating a compensation current flowing between the node and a second voltage rail, wherein the compensation current flows in the same direction as the leakage current between the first voltage rail and the second voltage rail.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 7 illustrates a schematic diagram of another example capacitor current-leakage compensated circuit in accordance with another aspect of the disclosure.

FIG. 8 illustrates a block diagram of an example integrated circuit (IC) in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "substantially" means that the associated parameter may not be exact as indicated but accounts for some variation due to specified tolerances.

Figure 1:
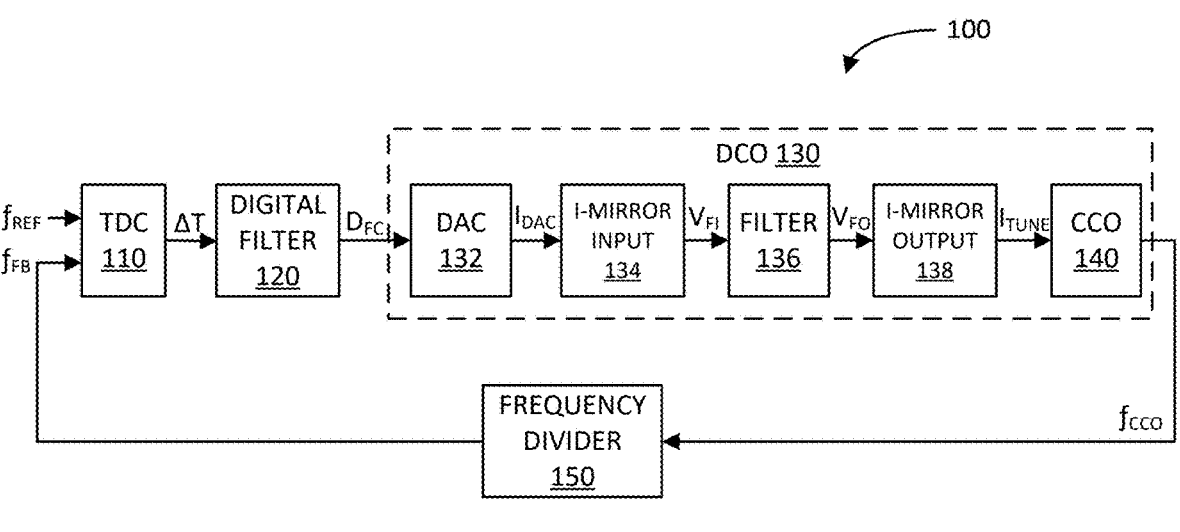
FIG. 1 illustrates a block diagram of an example digital phase locked loop (DPLL) in accordance with an aspect of the disclosure.

FIG. 1 illustrates a block diagram of an example digital phase locked loop (DPLL) 100 in accordance with an aspect of the disclosure. The DPLL 100 may be implemented in an IC. The DPLL 100 includes a time-to-digital converter (TDC) 110, a digital filter 120, a digitally-controlled oscillator (DCO) 130, and a frequency divider 150. The DCO 130, in turn, includes a digital-to-analog converter (DAC) 132, a current-mirror input 134, a filter 136, a current (I) mirror output 138, and a current-controlled oscillator (CCO) 140.

The TDC 110 is configured to phase compare a reference clock signal $f_{REF}$ with a feedback clock signal $f_{FB}$ including generating a signal related to a time difference $\Delta T$ between respective rising or falling edges (transitions) of the clock signals $f_{REF}$ and $f_{FB}$. The digital filter 120, operating as a loop filter for the DPLL 100, is configured to low pass filter (LPF) or integrate the time difference signal $\Delta T$ to generate a digital frequency control signal $D_{FC}$ for the DCO 130.

Regarding the operation of the DCO 130, the DAC 132 is configured to convert the digital frequency control signal $D_{FC}$ into a current $I_{DAC}$. The current-mirror input 134 is configured to generate a pre-filter voltage $V_{FI}$ based on the current $I_{DAC}$. The filter 136 is configured to low pass filter (LPF) the pre-filter voltage $V_{FI}$ so as to remove noise from the pre-filter voltage $V_{FI}$ to generate a filtered voltage $V_{FO}$. The current-mirror output 138 is configured to generate a frequency-tuning current $I_{TUNE}$ based on the filtered voltage $V_{FO}$. The CCO 140 is configured to generate an output clock signal $f_{CCO}$ based on the frequency-tuning current $I_{TUNE}$. The frequency divider 150 is configured to frequency divide the output clock signal $f_{CCO}$ to generate the feedback clock signal $f_{FB}$. Through the loop operation, the frequency-tuning current $I_{TUNE}$ is generated to cause a phase locking of the feedback clock signal $f_{FB}$ with the reference clock signal $f_{REF}$.

Figure 2A:
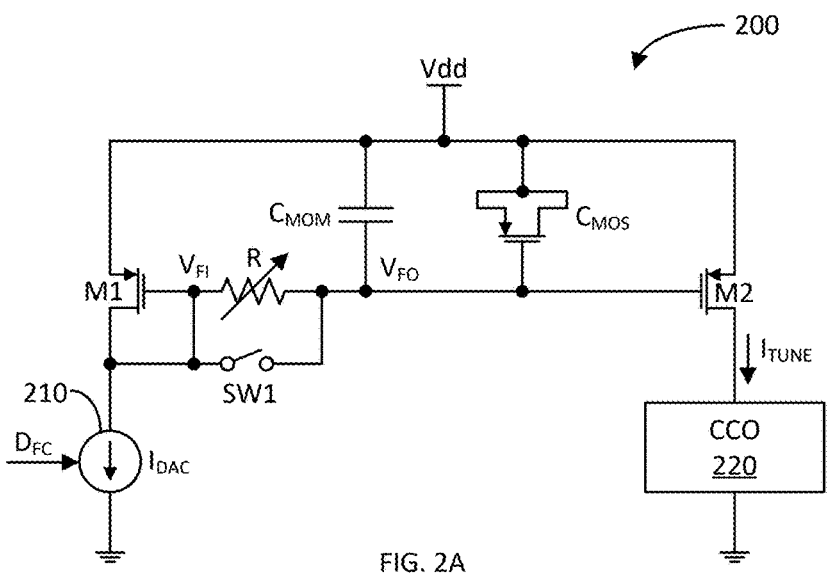
FIG. 2A illustrates a schematic/block diagram of an example digitally-controlled oscillator (DCO) in accordance with another aspect of the disclosure.

FIG. 2A illustrates a schematic/block diagram of an example digitally-controlled oscillator (DCO) 200 in accordance with another aspect of the disclosure. The DCO 200 may be an example more detailed implementation of the DCO 130 previously discussed.

In particular, the DCO 200 includes a first p-channel field effect transistor (PFET) M1 coupled in series with a current digital-to-analog converter (DAC) 210 between an upper voltage rail Vdd and a lower voltage rail (e.g., ground). That is, the first PFET M1 includes a source coupled to the upper voltage rail Vdd. The current DAC 210 is coupled between a drain of the first PFET M1 and the lower voltage rail. The gate and drain of the first PFET M1 are coupled together. The DCO 200 further includes a second PFET M2 coupled in series with a current-controlled oscillator (CCO) 220 between the upper voltage rail Vdd and the lower voltage rail. That is, the second PFET M2 includes a source coupled to the upper voltage rail Vdd. The CCO 220 is coupled between a drain of the second PFET M2 and the lower voltage rail.

The DCO 200 further includes a resistor R (which may have a variable or programmable resistance to change the filter characteristics, such as RC time constant or cutoff frequency) is coupled between the gates of the first PFET M1 and the second PFET M2. The DCO 200 may further include a first switching device SW1 (e.g., which may be implemented as a FET) coupled in parallel with the resistor R. Additionally, the DCO includes a first capacitor $C_{MOM}$ and a second capacitor $C_{MOS}$, both coupled in parallel between the upper voltage rail Vdd and the gate of the second PFET M2. The first capacitor $C_{MOM}$ may be implemented as a metal-oxide-metal (MOM) capacitor (e.g., or alternatively, or in addition to, may be implemented as a metal-insulator-metal (MIM) capacitor). The second capacitor $C_{MOS}$ may be implemented as a p-channel metal oxide semiconductor (MOS) capacitor including drain/source coupled to the upper voltage rail Vdd and a gate coupled to the gate of the second PFET M2.

In operation, the current DAC 210 is configured to generate a current $I_{DAC}$ based on the digital frequency control signal $D_{FC}$. The current $I_{DAC}$ flows from the upper voltage rail Vdd to the lower voltage rail through the first PFET M1. The first PFET M1 corresponds to the current-mirror input 134 of DCO 130. During an initial or start-up operation of the DCO 200, the first switching device SW1 is turned on (e.g., in a closed state) to bypass the resistor R; and thereby, effectively bypass the LPF formed by the resistor R and parallel capacitors $C_{MOM}$ and $C_{MOS}$ coupling (e.g., an RC filter). The LPF corresponds to the filter 136 of DCO 130. In this configuration, the gate of the first PFET M1 is directly coupled to the gate of the second PFET M2, which operates as the current-mirror output. Accordingly, the second PFET M2 corresponds to the current mirror output 138 of DCO 130. Thus, due to the current mirror coupling of the first and second PFETs M1-M2, a frequency-tuning current $I_{TUNE}$ is generated based on the DAC current $I_{DAC}$. The frequency-tuning current $I_{TUNE}$ flows from the upper voltage rail Vdd to the lower voltage rail via the second PFET M2 and the CCO 220.

The CCO 220 generates the output clock signal $f_{CCO}$, and in particular, its frequency based on the frequency-tuning current $I_{TUNE}$. One reason for bypassing the resistor R upon start-up is to achieve a faster phase locking time for the DPLL 100 compared to if the resistor R were not bypassed. Once phase locking is achieved, the first switching device SW1 may be turned off (e.g., in an open state), which effectively enables the LPF to reduce noise in the frequency-tuning current $I_{TUNE}$; and ultimately, to reduce phase noise in the output clock signal $f_{CCO}$.

One reason for the two types of capacitors $C_{MOM}$ and $C_{MOS}$ for implementing the LPF is to achieve a relatively high capacitance density. That is, to effectively low frequency reduce noise in the frequency-tuning current $I_{TUNE}$, and ultimately, phase noise in the output clock signal $f_{CCO}$, the RC time constant of the LPF may be set relatively high. This implies a large resistance R and a large capacitance $C_{MOM}+C_{MOS}$. To implement such a large capacitance, the capacitor $C_{MOM}$ may be stacked over the capacitor $C_{MOS}$ in an integrated circuit (IC) (See e.g., FIG. 2B discussed further herein). As an example, a capacitor bank using only MOM type capacitors may achieve a capacitance density of about nine (9) femto Farads (fF) per micrometer squared area ($\mu m^2$) (e.g., 9 fF/$\mu m^2$). Whereas a capacitor bank using MOM capacitors stacked over MOS capacitors may achieve a much higher capacitance density of about 28 fF/$\mu m^2$ to 39 fF/$\mu m^2$, depending on the bias voltage applied across the MOS capacitors.

In certain technology nodes, the MOS capacitors $C_{MOS}$ may be implemented with thick gate oxide to achieve relatively low leakage current through the capacitors $C_{MOS}$. However, in smaller technology nodes, thick gate oxide MOS capacitors $C_{MOS}$ may not be available. Accordingly, in such technology nodes, MOS capacitors $C_{MOS}$ may need to be implemented with thin gate oxide, which typically have significant leakage current. Such leakage current may adversely impact the operation of circuits to which the MOS capacitors are coupled. For example, with regard to the DCO 200, the leakage current of the MOS capacitor $C_{MOS}$ flows to the gate of the second PFET M2, and then through the resistor R to the gate of the first PFET M1. This produces a voltage drop across the resistor R, which causes the voltage $V_{FI}$ at the gate of the first PFET M1 to be different than the voltage $V_{FO}$ at the gate of the second PFET M2. This causes an error in the current mirror operation of the first and second PFETs M1 and M2, resulting in the frequency-tuning current $I_{TUNE}$ not accurately tracking the DAC current $I_{DAC}$. As a result, this may adversely impact the phase lock loop operation of the DPLL 100.

Figure 2B:
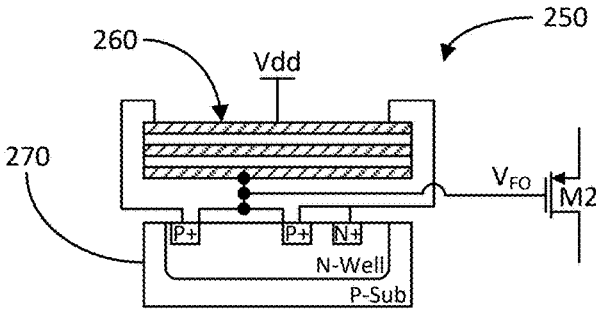
FIG. 2B illustrates a side cross-sectional view of an example metal-oxide-metal/metal oxide semiconductor (MOM/MOS) capacitor stack in accordance with another aspect of the disclosure.

FIG. 2B illustrates a side cross-sectional view of an example metal-oxide-metal/metal oxide semiconductor (MOM/MOS) capacitor stack 250 in accordance with another aspect of the disclosure. The MOM/MOS capacitor stack 250 may be an example implementation of the parallel capacitors $C_{MOM}$ and $C_{MOS}$ of DCO 200 previously discussed. The MOM/MOS capacitor stack 250 includes a MOM capacitor 260 including two or more metal layers (e.g., depicted with cross hatching) separated by one or more insulating layers (e.g., depicted without cross hatching). In this example, the MOM capacitor 260 includes a top metal layer coupled to the upper voltage rail Vdd, and a bottom metal layer coupled to the gate of PFET M2.

The MOM/MOS capacitor stack 250 further includes a p-channel MOS capacitor 270 including drain/source regions P+ formed within an N-well, which, in turn, is formed within a p-type substrate. The p-channel MOS capacitor 270 includes a gate polysilicon ("poly" for short) situated over the p-channel between the drain/source regions P+. The p-channel MOS capacitor 270 further includes an N-well contact region N+ coupled to the N-Well. In this example, the drain/source regions P+ and the N-well contact region N+ of the p-channel MOS capacitor 270 are coupled to the top metal layer of the MOM capacitor 260, and the gate of the MOS capacitor 270 is coupled to the bottom plate of the MOM capacitor 260 (as well as the gate of the second PFET M2.)

Figure 3:
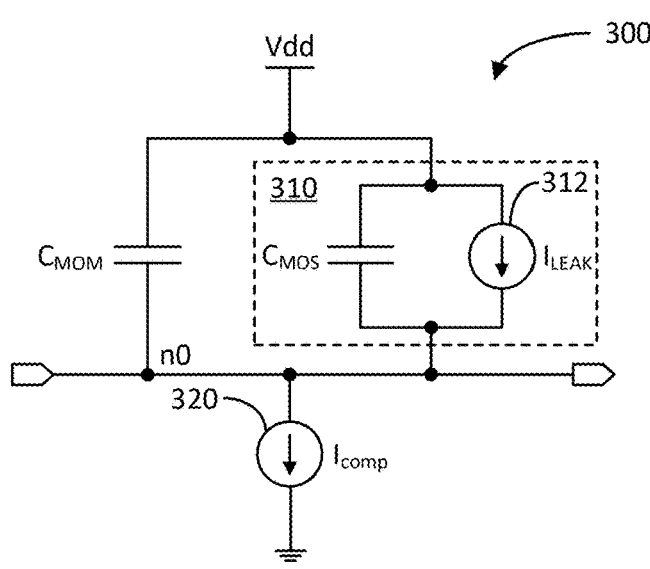
FIG. 3 illustrates a schematic diagram of an example capacitor current-leakage compensated circuit in accordance with another aspect of the disclosure.

FIG. 3 illustrates a schematic diagram of an example capacitor current-leakage compensated circuit 300 in accordance with another aspect of the disclosure. The capacitor current-leakage compensated circuit 300 may be used to compensate a circuit for current leakage from a p-channel MOS capacitor (e.g., substantially reduce or eliminate a net current flowing into the circuit due to leakage current from a MOS capacitor). The capacitor current-leakage compensated circuit 300 may be implemented in an IC.

In this example, the capacitor current-leakage compensated circuit 300 includes a "leaky" p-channel MOS capacitor 310 modeled as an ideal "non-leaky" MOS capacitor $C_{MOS}$ coupled in parallel with a current source 312 configured to generate the leakage current $I_{LEAK}$. The p-channel MOS capacitor 310 may be coupled in parallel with an optional MOM (and/or MIM) capacitor $C_{MOM}$ between an upper voltage rail Vdd and a node n0 pertaining to the circuit that may be adversely affected by the leakage current $I_{LEAK}$. The node n0 may be a part of a circuit to which the leakage current $I_{LEAK}$ may adversely impact.

Regarding current leakage compensation, the capacitor current-leakage compensated circuit 300 includes a current source 320 coupled between the node n0 and a lower voltage rail (e.g., ground). The current source 320 is configured to generate a compensation current $I_{COMP}$ that flows in the same direction as the leakage current $I_{LEAK}$ between the upper voltage rail and the lower voltage rail. The magnitude of the compensation current $I_{LEAK}$ that is related to (e.g., substantially the same as) the magnitude of the leakage current $I_{LEAK}$ of the p-channel MOS capacitor 310 (e.g., the magnitude of the compensation current $I_{COMP}$ may be greater than the magnitude of the leakage current $I_{LEAK}$ to account for other leakage current from other components). Thus, the net current flowing into the node n0 may be substantially zero (0) (e.g., $I_{LEAK}-I_{COMP}=0$, where $I_{COMP}=I_{LEAK}$). As the net current flowing into the node n0 is substantially zero (0), the leakage current $I_{LEAK}$ from the p-channel MOS capacitor 310 may not adversely impact the circuit to which the node n0 pertains.

Figure 4:
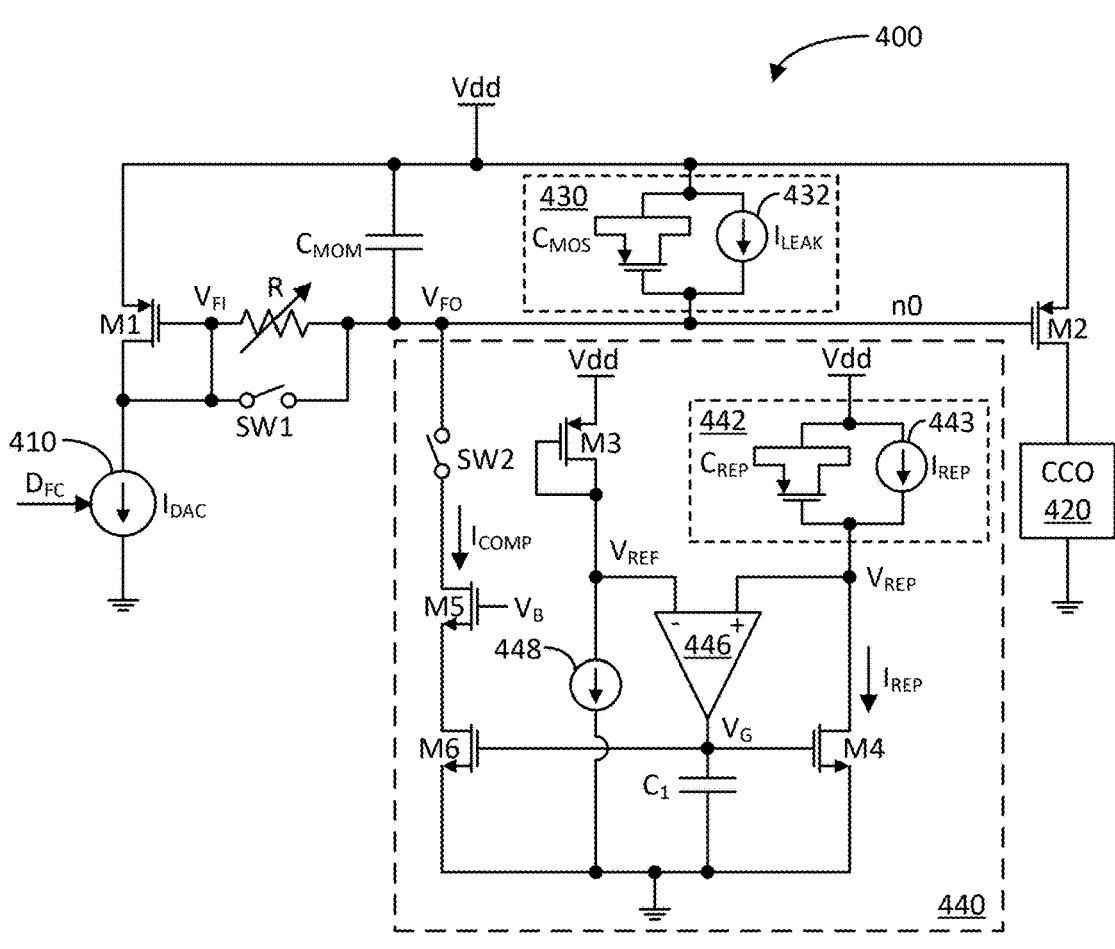
FIG. 4 illustrates a schematic/block diagram of another example digitally-controlled oscillator (DCO) in accordance with another aspect of the disclosure.

FIG. 4 illustrates a schematic/block diagram of an example digitally-controlled oscillator (DCO) 400 in accordance with another aspect of the disclosure. In this example, the DCO 400 includes an example capacitor current-leakage compensation circuit 440 configured to compensate for leakage current $I_{LEAK}$ from a p-channel MOS capacitor 430. The DCO 400 may be implemented in an IC.

In particular, the DCO 400 may be similar to DCO 200 previously discussed, including many of the same/similar elements, such as current DAC 410, PFETs M1 and M2, resistor R, first switching device SW1, MOM capacitor $C_{MOM}$, p-channel MOS capacitor 430, and CCO 420 in the same/similar arrangement as the corresponding elements in DCO 200. In this example, the p-channel MOS capacitor 430 is represented as an ideal "non-leaky" MOS capacitor $C_{MOS}$ and a current source 432, similar to p-channel MOS capacitor 310 previously discussed.

As mentioned, the DCO 400 includes a capacitor current-leakage compensation circuit 440 configured to generate a compensation current $I_{COMP}$ to substantially reduce or eliminate a net current flowing into the gate (node n0) of PFET M2 due to leakage current $I_{LEAK}$ of the p-channel MOS capacitor 430. In particular, the capacitor current-leakage compensation circuit 440 includes a replica p-channel MOS capacitor 442, an operational amplifier 446, a diode-connected PFET M3, a current source 448, a current mirror including n-channel field effect transistors (NFETs) M4 and M6, a noise-reducing capacitor $C_1$, a cascode NFET M5, and an optional second switching device SW2. The replica p-channel MOS capacitor 442 may be modeled as an ideal MOS capacitor $C_{REP}$ coupled in parallel with a replica current source 443.

A replica MOS capacitor is used to generate a replica leakage current (modeled by the replica current source) whose magnitude is substantially the same or a scaled down version of the leakage current of the MOS capacitor. The replica leakage current is used to generate a compensation current that counters the effects of the leakage current of the MOS capacitor. To generate the replica leakage current so that its magnitude is substantially the same or scaled down version of the leakage current of the MOS capacitor, the replica MOS capacitor may be of the same channel type (e.g., p- or n-channel) as the MOS capacitor, have a size substantially the same as or a scaled down version of the MOS capacitor, and be biased in substantially the same manner as the MOS capacitor.

More specifically, the replica p-channel MOS capacitor 442 may be coupled between the upper voltage rail Vdd and a first (e.g., positive) input of the operational amplifier 446. The replica current source 443 is configured to generate a replica leakage current $I_{REP}$. The replica current source 443 is coupled in series with the input current-mirror NFET M4 between the upper voltage rail and the lower voltage rail (e.g., ground). More specifically, the NFET M4 includes a drain coupled to the first (e.g., positive) input of the operational amplifier 446, a source coupled to the lower voltage rail, and a gate coupled to an output of the operational amplifier 446 and a gate of the output current mirror NFET M6. The noise-reducing capacitor C1 is coupled between the output of the operational amplifier and the lower voltage rail.

The diode-connected PFET M3 is coupled in series with the current source 448 between the upper voltage rail and the lower voltage rail. That is, the diode-connected PFET M3 includes a source coupled to the upper voltage rail Vdd, and gate and drain coupled together and to a second (e.g., negative) input of the operational amplifier 446. The current source 448 is coupled between the second (e.g., negative) input of the operational amplifier 446 and the lower voltage rail. The second switching device SW2, the drain and source of the cascode NFET M5, and the drain and source of the NFET M6 are coupled in series between the gate (node n0)

of PFET M2 and the lower voltage rail. The cascode NFET M5 includes a gate configured to receive a bias voltage $V_B$.

In operation, the replica current source 443 is configured to generate a replica leakage current $I_{REP}$ that may be a scaled-down version (e.g., 10×) of the leakage current $I_{LEAK}$ of the p-channel MOS capacitor 430. The diode-connected PFET M3 and the current source 448 are configured to generate a reference voltage $V_{REF}$ that may be substantially equal to the filter output voltage $V_{FO}$ at the gate (node n0) of the PFET M2. Through negative feedback operation, the operational amplifier 446 is configured to generate a gate voltage $V_G$ for the NFET M4 such that a replica voltage $V_{REP}$ at the first (e.g., positive) input of the operational amplifier 446 is substantially the same as the reference voltage $V_{REF}$. Thus, the because the replica voltage $V_{REP}$ is substantially the same as the filter output voltage $V_{FO}$, the bias voltage across the replica p-channel MOS capacitor 442 is substantially the same as the bias voltage across the p-channel MOS capacitor 430 (e.g., both having a gate-to-source/drain voltage of substantially Vdd-$V_{FO}$).

The replica current $I_{REP}$ flows through the NFET M4. The NFETs M4 and M6 are coupled in a current-mirror configuration (e.g., both having the substantially the same gate-to-source voltage $V_{GS}$) to generate a compensation current $I_{COMP}$ through the NFET M6 that is related to the replica current $I_{REP}$ by a scaling factor (e.g., 10×). That is, the NFET M6 may be sized with respect to the NFET M4 to produce a current gain $I_{COMP}/I_{REP}$ to achieve the desired scaling factor (e.g., 10×). As previously discussed, the replica p-channel MOS capacitor 442 may be sized with respect to the p-channel MOS capacitor 430 such that the replica current $I_{REP}$ is a down scaled version (e.g., 1/10) of the leakage current $I_{LEAK}$. Thus, the scaling factor of the current mirror M6/M4 may be set so that the magnitude of the compensation current $I_{COMP}$ is related (e.g., substantially equal) to the magnitude of the leakage current $I_{LEAK}$ (e.g., or slightly higher to account for leakage current into node n0 via PFETs M1 and M2).

The cascode NFET M5 increases the output impedance of the capacitor current-leakage compensation circuit 440 so that the compensation current $I_{COMP}$ remains substantially constant with variation in the filter output voltage $V_{FO}$. The second switching device SW2 is configured to selectively enable (e.g., in the ON or closed state) or disable (e.g., in the OFF or open state) the capacitor current-leakage compensation circuit 440. If the optional second switching device SW2 is not implemented, the drain of the cascode NFET M5 may be directly coupled to the gate (node n0) of the second PFET M2. In such configuration, the capacitor current-leakage compensation circuit 440 may be always enabled. Similarly, the compensation current $I_{COMP}$ flows in the same direction as the leakage current $I_{LEAK}$ between the upper voltage rail and the lower voltage rail. As the magnitude of the compensation current $I_{COMP}$ may be substantially equal to the magnitude of the leakage current $I_{LEAK}$ of the p-channel MOS capacitor 430, the net current flowing through the resistor R is substantially zero (0) so as not to adversely impact the current mirroring operation of PFETs M1 and M2.

Figure 5:
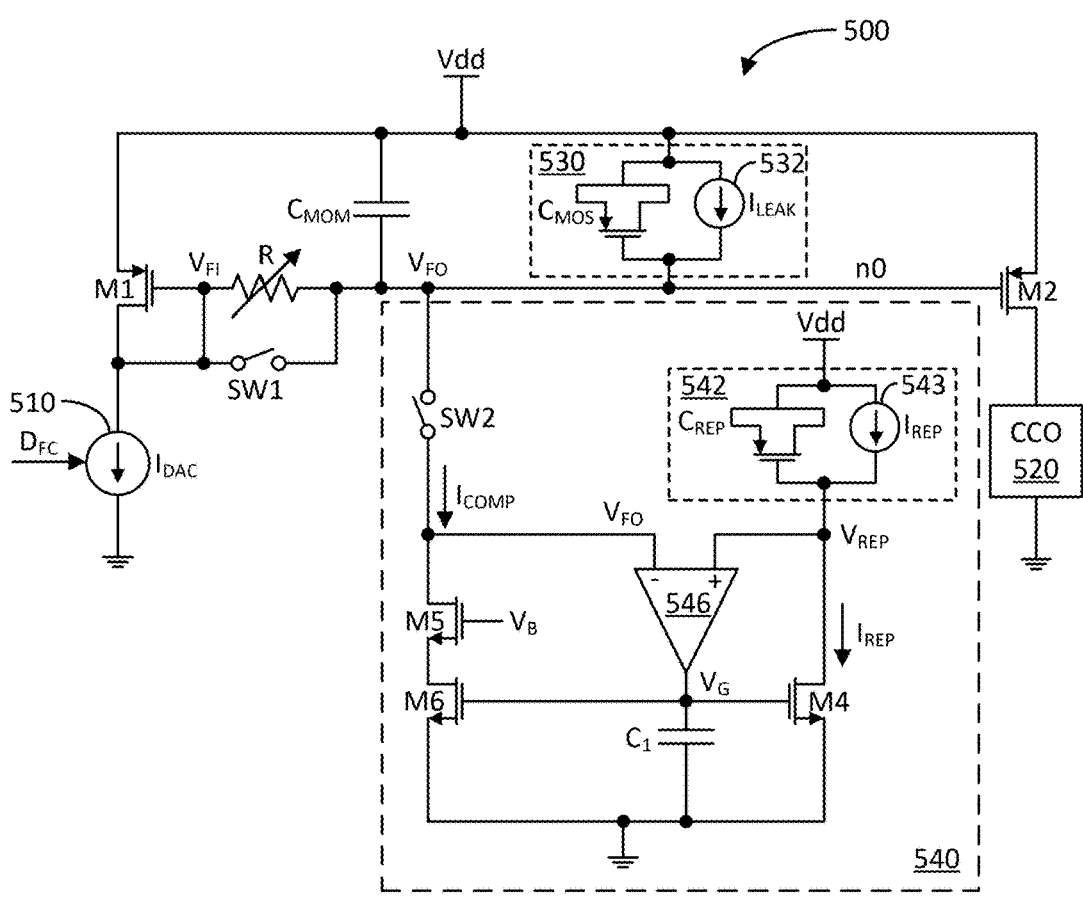
FIG. 5 illustrates a schematic/block diagram of another example digitally-controlled oscillator (DCO) in accordance with another aspect of the disclosure.

FIG. 5 illustrates a schematic/block diagram of another example digitally-controlled oscillator (DCO) 500 in accordance with another aspect of the disclosure. The DCO 500 is similar to that of DCO 400 previously discussed, but includes a modified capacitor current-leakage compensation circuit 540. The DCO 500 may be implemented in an IC.

In particular, the DCO 500 may be similar to DCOs 200 and 400 previously discussed, including many of the same/ similar elements, such as current DAC 510, PFETs M1 and M2, resistor R, first switching device SW1, MOM capacitor $C_{MOM}$, p-channel MOS capacitor 530, and CCO 520 in the same/similar arrangement as the corresponding elements in DCOs 200 and 400. In this example, the p-channel MOS capacitor 530 is represented as an ideal "non-leaky" MOS capacitor $C_{MOS}$ and a current source 532, similar to p-channel MOS capacitors 310 and 430 previously discussed.

Similar to capacitor current-leakage compensation circuit 440, the capacitor current-leakage compensation circuit 540 includes a replica p-channel MOS capacitor 542, an operational amplifier 546, a current mirror including NFETs M4 and M6, a noise-reducing capacitor $C_1$, a cascode NFET M5, and an optional second switching device SW2. Similarly, the replica MOS capacitor 542 may be modeled as an ideal MOS capacitor $C_{REP}$ coupled in parallel with a replica current source 543.

The capacitor current-leakage compensation circuit 540 differs from capacitor current-leakage compensation circuit 440 in that the operational amplifier 546 directly senses the filter-output voltage $V_{FO}$ instead of generating a reference voltage $V_{REF}$ that substantially approximates the filter-output voltage $V_{FO}$. In this regard, the operational amplifier 546 includes a first (e.g., negative) input coupled to a node between the second switching device SW2 and the cascode NFET M5 (or coupled to the gate (node n0) of the second PFET M2 if the optional second switching device SW2 is not implemented).

The operation of the capacitor current-leakage compensation circuit 540 is similar to that of the capacitor current-leakage compensation circuit 440. The operational amplifier 546 is configured to control a gate voltage $V_G$ of the current mirror NFETs M4 and M6 to generate a bias voltage Vdd-$V_{REP}$ across the replica p-channel MOS capacitor 542 that is substantially the same as the bias voltage Vdd-$V_{FO}$ across the p-channel MOS capacitor 530. Biased with substantially the same bias voltage Vdd-$V_{REP}$, the replica p-channel MOS capacitor 542 produces a replica current $I_{REP}$ that flows through the NFET M4. The NFETs M4 and M6 are coupled in a current-mirror configuration to generate a compensation current $I_{COMP}$ through the NFET M6 that is related to the replica current $I_{REP}$ by a scaling factor (e.g., 10×). That is, the NFET M6 may be sized with respect to the NFET M4 to produce a current gain $I_{COMP}/I_{REP}$ to achieve the desired scaling factor (e.g., 10×). Similarly, the replica p-channel MOS capacitor 542 may be sized with respect to the p-channel MOS capacitor 530 such that the replica current $I_{REP}$ is a down scaled version (e.g., 1/10) of the leakage current $I_{LEAK}$. Thus, the scaling factor of the current mirror M6/M4 may be set so that the compensation current $I_{COMP}$ is substantially equal to (or higher than) the leakage current $I_{LEAK}$.

The cascode NFET M5 increases the output impedance of the capacitor current-leakage compensation circuit 540 so that the compensation current $I_{COMP}$ remains substantially constant with variation in the filter output voltage $V_{FO}$. The second switching device SW2 is configured to selectively enable (e.g., in the ON or closed state) or disable (e.g., in the OFF or open state) the capacitor current-leakage compensation circuit 540. Similarly, the compensation current $I_{COMP}$ flows the same direction as the leakage current $I_{LEAK}$ between the upper voltage rail and the lower voltage rail. As the magnitude of the compensation current $I_{COMP}$ may be substantially equal to the leakage current $I_{LEAK}$ of the p-channel MOS capacitor 530, the net current flowing through the resistor R is substantially zero (0) so as not to adversely impact the current mirroring operation of PFETs M1 and M2.

Figure 6:
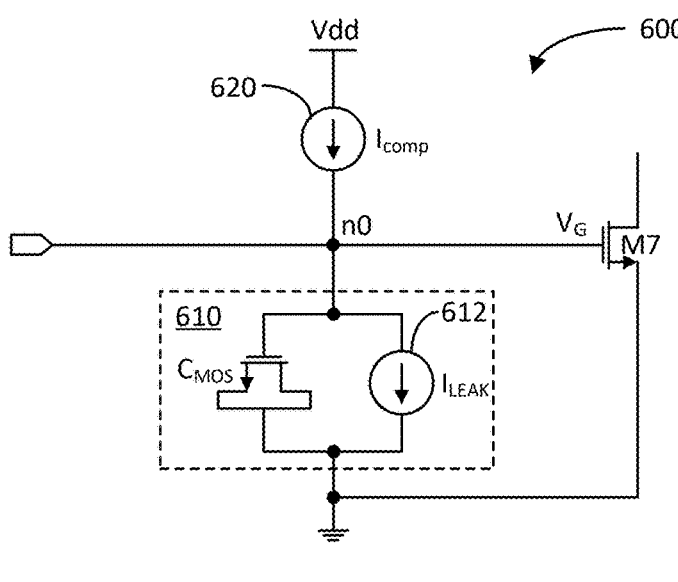
FIG. 6 illustrates a schematic diagram of another example capacitor current-leakage compensated circuit in accordance with another aspect of the disclosure.

FIG. 6 illustrates a schematic diagram of another example capacitor current-leakage compensated circuit 600 in accordance with another aspect of the disclosure. The capacitor current-leakage compensated circuit 600 may be implemented in an IC. As previously discussed, the capacitor current-leakage compensated circuit 300 dealt with compensating for leakage current produced by a p-channel MOS capacitor. In contrast, the capacitor current-leakage compensated circuit 600 deals with compensating for current leakage produced by an n-channel MOS capacitor.

In particular, the capacitor current-leakage compensated circuit 600 includes a "leaky" n-channel MOS capacitor 610 modeled as an ideal "non-leaky" MOS capacitor $C_{MOS}$ coupled in parallel with a current source 612 configured to generate a leakage current $I_{LEAK}$. The n-channel MOS capacitor 610 may be coupled between a node n0 and a lower voltage rail (e.g., ground). The node n0 may be a part of a circuit to which the leakage current $I_{LEAK}$ may adversely impact.

Regarding current leakage compensation, the capacitor current-leakage compensated circuit 600 further includes a current source 620 coupled between an upper lower voltage rail Vdd and the node n0. The current source 620 is configured to generate a compensation current $I_{COMP}$ that flows the same direction as the leakage current $I_{LEAK}$ between the upper voltage rail and the lower voltage rail. The magnitude of the compensation current $I_{COMP}$ related to (e.g., substantially equal, or greater to account for other leakage current from other components) the magnitude of the leakage current $I_{LEAK}$ of the n-channel MOS capacitor 610. Thus, as such, the net current flowing into the node n0 is substantially zero (0) (e.g., $I_{COMP}-I_{LEAK}=0$, where $I_{COMP}=I_{LEAK}$). Thus, as the net current flowing out of the node n0 is substantially zero (0), the leakage current $I_{LEAK}$ from the n-channel MOS capacitor 610 does not substantially impact the circuit to which the node n0 pertains.

FIG. 7 illustrates a schematic diagram of an example integrated circuit (IC) 700 including a capacitor current-leakage compensation circuit 740 in accordance with another aspect of the disclosure. The capacitor current-leakage compensation circuit 740 is modeled after the capacitor current-leakage compensation circuit 540, which directly senses the voltage at the node n0 to which the leakage current flows into (e.g., in the case of compensation circuit 540) or out of (in the case of compensation circuit 740). However, it shall be understood that the capacitor current-leakage compensation circuit 740 may be modeled after the capacitor current-leakage compensation circuit 440, which generates a reference voltage $V_{REF}$ that substantially approximates the voltage at the node n0 to which the leakage current flows.

In particular, the IC 700 includes a circuit including a n-channel MOS capacitor 710 coupled to a gate of an NFET M7. The NFET M7 serves as an example of a circuit component coupled to a MOS capacitor. The n-channel MOS capacitor 710 may be modeled as an ideal "non-leaky" MOS capacitor $C_{MOS}$ and a current source 712 configured to generate a leakage current $I_{LEAK}$ of the n-channel MOS capacitor 710. The n-channel MOS capacitor $C_{MOS}$ and the current source 712 are coupled in parallel between the gate (node n0) of the NFET M7 and a lower voltage rail (e.g., ground). The leakage current $I_{LEAK}$ flows out of the gate (node 0) of NFET M7.

The capacitor current-leakage compensation circuit 740 includes a replica n-channel MOS capacitor 720, an operational amplifier 746, a current mirror including PFETs M8 and M9, and a noise-reducing capacitor $C_1$. It shall be understood that the capacitor current-leakage compensation circuit 740 may include a cascode PFET between the PFET M9 and a second (e.g., negative) input of the operational amplifier 746. Similarly, it shall be understood that the capacitor current-leakage compensation circuit 740 may include a switching device between the second (e.g., negative) input of the operational amplifier 746 and the gate (node n0) of the NFET M7.

Similarly, the replica n-channel MOS capacitor 720 may be modeled as an ideal MOS capacitor $C_{REP}$ coupled in parallel with a replica current source 722 between a first (e.g., positive) input of the operational amplifier 746 and the lower voltage rail. The input current mirror PFET M8 includes a source coupled to an upper voltage rail Vdd, a gate coupled to a gate of the output current mirror PFET M9, and a drain coupled to the first (e.g., positive) input of the operational amplifier 746 (as well as the replica n-channel MOS capacitor 720). The output current mirror PFET M9 includes a source coupled to the upper voltage rail Vdd, and a drain coupled to the second (e.g., negative) input of the operational amplifier 746 (as well as the gate (node n0) of the NFET M7). The noise-reducing capacitor $C_1$ is coupled between the upper voltage rail Vdd and an output of the operational amplifier 746, which is also coupled to the gates of the current mirror PFETs M8 and M9.

In operation, the operational amplifier 746 is configured to control a gate voltage $V_{G1}$ of the current mirror PFETs M8 and M9 to generate a replica bias voltage $V_{REP}$ across the replica n-channel MOS capacitor 720 that is substantially the same as the bias voltage $V_{G7}$ across the n-channel MOS capacitor 710. Based on substantially the same bias voltage, the replica n-channel MOS capacitor 720 generates a replica current $I_{REP}$ that flows through PFET M8. The PFETs M8 and M9 are coupled in a current-mirror configuration to generate a compensation current $I_{COMP}$ through the PFET M9 that is related to the replica current $I_{REP}$ by a scaling factor (e.g., 10×). That is, the PFET M9 may be sized with respect to the PFET M8 to produce a current gain $I_{COMP}/I_{REP}$ to achieve the desired scaling factor (e.g., 10×). Similarly, the replica n-channel MOS capacitor 720 may be sized with respect to the n-channel MOS capacitor 710 such that the replica current $I_{REP}$ is a down scaled version (e.g., ¹/10) of the leakage current $I_{LEAK}$. Thus, the scaling factor of the current mirror M8/M9 may be set so that the compensation current $I_{COMP}$ is substantially equal to the leakage current $I_{LEAK}$.

Similarly, the compensation current $I_{COMP}$ flows the same direction as the leakage current $I_{LEAK}$ between the upper voltage rail and the lower voltage rail. As the magnitude of the compensation current $I_{COMP}$ is related to (e.g., substantially equal or greater than to account for leakage current from other components) the magnitude of the leakage current $I_{LEAK}$ of the n-channel MOS capacitor 710, the net leakage current flowing out of the gate (node n0) of the NFET M7 is substantially zero (0) so as not to adversely impact the operation of the circuit including the NFET M7 and the n-channel MOS capacitor 710.

FIG. 8 illustrates a block diagram of an example integrated circuit (IC) 800 in accordance with another aspect of the disclosure. The IC 800 includes a capacitor bank 810 including an array of MOM-MOS stacked capacitors (e.g., an array of MOM capacitors stacked over an array of MOS capacitors, respectively). In this example, the capacitor bank 810 includes 21 MOM-MOS stacked capacitors arranged in three (3) rows each having six (6) MOM-MOS stacked capacitors, and one (1) row having three (3) MOM-MOS stacked capacitors.

The IC 800 further includes a first voltage rail 830, which, in a first configuration, is an upper voltage rail Vdd, and in a second configuration, is a lower voltage rail (e.g., ground). Additionally, the IC 800 includes a node 840 to which current leakage compensation is provided to reduce a net current flowing into or out of the node 840 due to leakage current $I_{LEAK}$ generated by the MOS capacitors of the capacitor bank 810. The MOM capacitors and MOS capacitors of the capacitor bank 810 are coupled in parallel between the first voltage rail 830 and the node 840. In the first configuration, the leakage current $I_{LEAK}$ (as indicated by a solid arrow line) of each of the MOS capacitors of the capacitor bank 810 flows from the upper voltage rail 830 to the node 840. In such configuration, the MOS capacitors may be of the p-channel type. In the second configuration, the leakage current $I_{LEAK}$ (as indicated by a dashed arrow line) of each of the MOS capacitors of the capacitor bank 810 flows from the node 840 to the lower voltage rail 830. In such configuration, the MOS capacitors of the capacitor bank may be of the n-channel type.

The IC 800 further includes a capacitor current-leakage compensation circuit 820 and a second voltage rail 850. The capacitor current-leakage compensation circuit 820 is coupled between the node 840 and the second voltage rail 850. In the first configuration, the second voltage rail 850 is the lower voltage rail (e.g., ground), and in the second configuration, the second voltage rail 850 is the upper voltage rail Vdd. In the first configuration, the capacitor current-leakage compensation circuit 820 is configured to generate a compensation current $I_{COMP}$ (as indicated by a solid arrow line) that flows from the node 840 to the lower voltage rail 850. In the second configuration, the capacitor current-leakage compensation circuit 820 is configured to generate a compensation current $I_{COMP}$ (as indicated by a dashed arrow line) that flows from the upper voltage rail 850 to the node 840.

So as to substantially reduce or cancel the net current flowing into or out of the node 840 so as not to adversely impact the operation of the circuit to which the node 840 pertains, the capacitor current-leakage compensation circuit 820 is configured to generate the compensation current $I_{COMP}$ so that it is related to (e.g., substantially equal or greater to account for other leakage current) the total leakage current from the capacitor bank 810.

Similarly, the compensation current $I_{COMP}$ flows in the same direction as the leakage current $I_{LEAK}$ between the first voltage rail 830 and the second voltage rail. As, in this example, the capacitor bank 810 includes 21 MOS capacitors, and the leakage current $I_{LEAK}$ has been defined as the leakage current from each MOS capacitor, and further assuming that the leakage current $I_{LEAK}$ from each MOS capacitor is substantially the same, the capacitor current-leakage compensation circuit 820 may generate the compensation current $I_{COMP}$ to be substantially equal to 21 times the leakage current $I_{LEAK}$ (e.g., $I_{COMP}=21*I_{LEAK}$).

In such case, the capacitor current-leakage compensation circuit 820 may include a set of replica MOS capacitors (e.g., each implemented as replica MOS capacitor 442, 542, or 720) coupled to a current mirror (e.g., each implemented as current mirror M4/M6 or M8/M9) to generate the desired compensation current $I_{COMP}$. Alternatively, or in addition to, the IC 800 may include a set of capacitor current-leakage compensation circuits 820 (e.g., each implemented per capacitor current-leakage compensation circuit 440, 540, or 740) to collectively generate the desired compensation current $I_{COMP}$.

Figure 9:
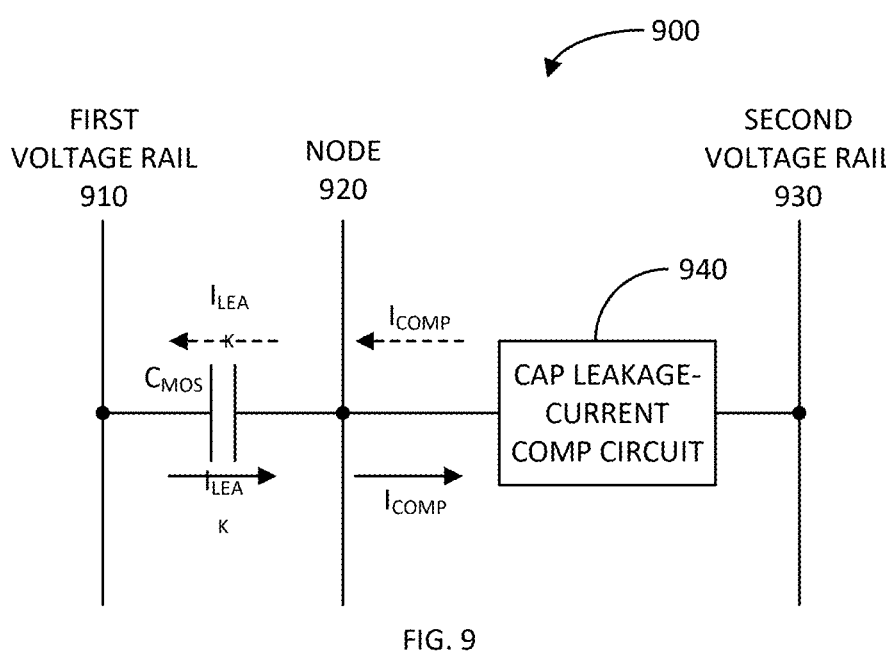
FIG. 9 illustrates a schematic diagram of another example integrated circuit (IC) in accordance with another aspect of the disclosure.

FIG. 9 illustrates a schematic diagram of another example integrated circuit (IC) 900 in accordance with another aspect of the disclosure. The IC 900 includes a metal-oxide-semiconductor (MOS) capacitor $C_{MOS}$ coupled between a first voltage rail 910 and a node 920, wherein the MOS capacitor $C_{MOS}$ generates a leakage current $I_{LEAK}$ while in operation, the leakage current $I_{LEAK}$ flowing between the first voltage rail 910 and the node 920. For example, the leakage current $I_{LEAK}$ may flow from the first voltage rail 910 to the node 920 per a first configuration as indicated by the solid arrow line. Or, the leakage current $I_{LEAK}$ may flow from the node 920 to the first voltage rail 910 per a second configuration as indicated by the solid arrow line.

The IC 900 further includes a capacitor leakage-current compensation circuit 940 coupled between the node 920 and a second voltage rail 930, wherein the capacitor leakage-current compensation circuit 940 is configured to generate a compensation current $I_{COMP}$ flowing between the node 920 and a second voltage rail 930, the compensation current $I_{COMP}$ flowing in the same direction as the leakage current $I_{LEAK}$ between the first voltage rail 910 and the second voltage rail 930. For example, the compensation current $I_{COMP}$ may flow from the node 920 to the second voltage rail 930 per the first configuration as indicated by the solid arrow line (e.g., in the same direction as the leakage current $I_{LEAK}$ from the first voltage rail 910 to the second voltage rail 930). Or, the compensation current $I_{COMP}$ may flow from the second voltage rail 930 to the node 920 per the second configuration as indicated by the dashed arrow line (e.g., in the same direction as the leakage current $I_{LEAK}$ from the node 920 to the first voltage rail 910). As a consequence, the net current flowing into or out of the node 920 is substantially reduced or cancelled if the magnitude of the compensation current $I_{COMP}$ is substantially the same as the magnitude of the leakage current $I_{LEAK}$.

Figure 10:
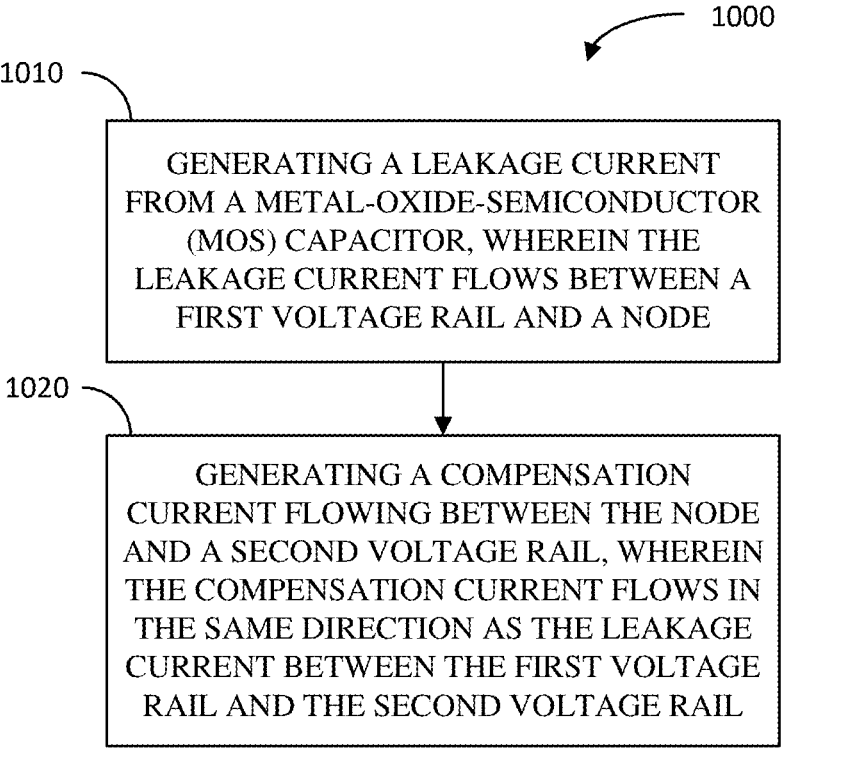
FIG. 10 illustrates a flow diagram of an example method of reducing a net current into or out of a node due to capacitor current leakage into or out of the node in accordance with another aspect of the disclosure.

FIG. 10 illustrates a flow diagram of an example method 1000 of reducing a net current into or out of a node due to capacitor current leakage into or out of the node in accordance with another aspect of the disclosure. The method 1000 includes generating a leakage current from a metal-oxide-semiconductor (MOS) capacitor, wherein the leakage current flows between a first voltage rail and a node (block 1010). The method 1000 further includes generating a compensation current flowing between the node and a second voltage rail, wherein the compensation current flows in the same direction as the leakage current between the first voltage rail and the second voltage rail (block 1020).

The following provides an overview of aspects of the present disclosure:

Aspect 1: An integrated circuit (IC), comprising: a metal-oxide-semiconductor (MOS) capacitor coupled between a first voltage rail and a node, wherein the MOS capacitor generates a leakage current while in operation, the leakage current flowing between the first voltage rail and the node; and a capacitor leakage-current compensation circuit coupled between the node and a second voltage rail, wherein the capacitor leakage-current compensation circuit is configured to generate a compensation current flowing between the node and the second voltage rail, the compensation current flowing in the same direction as the leakage current between the first voltage rail and the second voltage rail.

Aspect 2: The IC of aspect 1, wherein a magnitude of the compensation current is related to a magnitude of the leakage current.

Aspect 3: The IC of aspect 1 or 2, wherein: the first voltage rail comprises an upper voltage rail; the second voltage rail comprises a lower voltage rail; and the MOS capacitor comprises a p-channel MOS capacitor.

Aspect 4: The IC of aspect 3, wherein the capacitor leakage-current compensation circuit comprises: a replica p-channel MOS capacitor configured to generate a replica leakage current; and a current mirror configured to generate the compensation current based on the replica leakage current.

Aspect 5: The IC of aspect 4, wherein the current mirror comprises: a first n-channel field effect transistor (NFET), wherein the replica p-channel MOS capacitor is coupled in series with the first NFET between the upper voltage rail and the lower voltage rail; and a second NFET coupled between the node and the lower voltage rail, wherein a gate of the first NFET is coupled to a gate of the second NFET.

Aspect 6: The IC of aspect 5, wherein the capacitor leakage-current compensation circuit further comprises: a reference voltage generator; and an operational amplifier including a first input coupled to a first node between the replica p-channel MOS capacitor and the first NFET, a second input coupled to the reference voltage generator, and an output coupled to the gates of the first and second NFETs.

Aspect 7: The IC of aspect 6, wherein the reference voltage generator comprises: a diode-connected p-channel field effect transistor (PFET); and a current source, wherein the diode-connected PFET is coupled in series with the current source between the upper voltage rail and the lower voltage rail, wherein the second input of the operational amplifier is coupled to a second node between the diode-connected PFET and the current source.

Aspect 8: The IC of aspect 5, wherein the capacitor leakage-current compensation circuit further comprises an operational amplifier including a first input coupled to a first node between the replica p-channel MOS capacitor and the first NFET, a second input coupled to the node, and an output coupled to the gates of the first and second NFETs.

Aspect 9: The IC of any one of aspects 5-8, wherein the capacitor leakage-current compensation circuit further comprises a third NFET coupled between the second NFET and the node, wherein the third NFET includes a gate configured to receive a bias voltage.

Aspect 10: The IC of aspect 1, wherein: the first voltage rail comprises a lower voltage rail; the second voltage rail comprises an upper voltage rail; and the MOS capacitor comprises an n-channel MOS capacitor.

Aspect 11: The IC of aspect 10, wherein the capacitor leakage-current compensation circuit comprises: a replica n-channel MOS capacitor configured to generate a replica leakage current; and a current mirror configured to generate the compensation current based on the replica leakage current.

Aspect 12: The IC of aspect 11, wherein the current mirror comprises: a first p-channel field effect transistor (PFET) coupled in series with the replica n-channel MOS capacitor between the upper voltage rail and the lower voltage rail; and a second PFET coupled between the upper voltage rail and the node, wherein a gate of the first PFET is coupled to a gate of the second PFET.

Aspect 13: The IC of aspect 12, wherein the capacitor leakage-current compensation circuit further comprises an operational amplifier including a first input coupled to a first node between the first PFET and the replica n-channel MOS capacitor, a second input coupled to a reference voltage generator or the node, and an output coupled to the gates of the first and second PFETs.

Aspect 14: The IC of any one of aspects 1-13, further comprising a metal-oxide-metal (MOM) capacitor coupled in parallel with the MOS capacitor between the first voltage rail and the node, wherein the MOM capacitor is stacked over the MOS capacitor.

Aspect 15: The IC of aspect 14, wherein the MOM capacitor stacked over the MOS capacitor is part of a capacitor bank including an array of MOM capacitors stacked over and coupled in parallel with an array of MOS capacitors between the first voltage rail and the node, respectively, wherein the array of MOS capacitors generate the leakage current while in operation.

Aspect 16: The IC of any one of aspects 1-15, further comprising a digitally-controlled oscillator (DCO) comprising: a current digital-to-analog converter (DAC); a first field effect transistor (FET) coupled in series with the current DAC between the first voltage rail and the second voltage rail, wherein the first FET includes a gate and a drain coupled together; a current-controlled oscillator (CCO); a second FET coupled in series with the CCO between the first voltage rail and the second voltage rail; and a resistor coupled between the gate of the first FET and a gate of the second FET.

Aspect 17: A method, comprising: generating a leakage current from a metal-oxide-semiconductor (MOS) capacitor, wherein the leakage current flows between a first voltage rail and a node; and generating a compensation current flowing between the node and a second voltage rail, wherein the compensation current flows in the same direction as the leakage current between the first voltage rail and the second voltage rail.

Aspect 18: The method of aspect 17, wherein a magnitude of the compensation current is substantially equal to a magnitude of the leakage current.

Aspect 19: The method of aspect 17 or 18, wherein generating the compensation current comprises: generating a replica leakage current; and mirroring the replica leakage current to generate the compensation current.

Aspect 20: The method of any one of aspects 17-19, wherein generating the compensation current comprises applying a replica bias voltage across a replica MOS capacitor configured to generate the compensation current, the replica bias voltage being substantially equal to a bias voltage across the MOS capacitor.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit (IC), comprising:
a metal-oxide-semiconductor (MOS) capacitor coupled between a first voltage rail and a node, wherein the MOS capacitor generates a leakage current while in operation, the leakage current flowing between the first voltage rail and the node;

a capacitor leakage-current compensation circuit coupled between the node and a second voltage rail, wherein the capacitor leakage-current compensation circuit is configured to generate a compensation current flowing between the node and the second voltage rail, the compensation current flowing in the same direction as the leakage current between the first voltage rail and the second voltage rail; and a metal-oxide-metal (MOM) capacitor coupled in parallel with the MOS capacitor between the first voltage rail and the node, wherein the MOM capacitor is stacked over the MOS capacitor.

2. The IC of claim 1, wherein a magnitude of the compensation current is related to a magnitude of the leakage current.

3. The IC of claim 1, wherein:
the first voltage rail comprises an upper voltage rail;
the second voltage rail comprises a lower voltage rail; and
the MOS capacitor comprises a p-channel MOS capacitor.

4. The IC of claim 3, wherein the capacitor leakage-current compensation circuit comprises:
a replica p-channel MOS capacitor configured to generate a replica leakage current; and
a current mirror configured to generate the compensation current based on the replica leakage current.

5. The IC of claim 4, wherein the current mirror comprises:
a first n-channel field effect transistor (NFET), wherein the replica p-channel MOS capacitor is coupled in series with the first NFET between the upper voltage rail and the lower voltage rail; and
a second NFET coupled between the node and the lower voltage rail, wherein a gate of the first NFET is coupled to a gate of the second NFET.

6. The IC of claim 5, wherein the capacitor leakage-current compensation circuit further comprises:
a reference voltage generator; and
an operational amplifier including a first input coupled to a first node between the replica p-channel MOS capacitor and the first NFET, a second input coupled to the reference voltage generator, and an output coupled to the gates of the first and second NFETs.

7. The IC of claim 6, wherein the reference voltage generator comprises:
a diode-connected p-channel field effect transistor (PFET); and
a current source, wherein the diode-connected PFET is coupled in series with the current source between the upper voltage rail and the lower voltage rail, wherein the second input of the operational amplifier is coupled to a second node between the diode-connected PFET and the current source.

8. The IC of claim 5, wherein the capacitor leakage-current compensation circuit further comprises an operational amplifier including a first input coupled to a first node between the replica p-channel MOS capacitor and the first NFET, a second input coupled to the node, and an output coupled to the gates of the first and second NFETs.

9. The IC of claim 5, wherein the capacitor leakage-current compensation circuit further comprises a third NFET coupled between the second NFET and the node, wherein the third NFET includes a gate configured to receive a bias voltage.

10. The IC of claim 1, wherein:
the first voltage rail comprises a lower voltage rail;
the second voltage rail comprises an upper voltage rail; and
the MOS capacitor comprises an n-channel MOS capacitor.

11. The IC of claim 10, wherein the capacitor leakage-current compensation circuit comprises:
a replica n-channel MOS capacitor configured to generate a replica leakage current; and
a current mirror configured to generate the compensation current based on the replica leakage current.

12. The IC of claim 11, wherein the current mirror comprises:
a first p-channel field effect transistor (PFET) coupled in series with the replica n-channel MOS capacitor between the upper voltage rail and the lower voltage rail; and
a second PFET coupled between the upper voltage rail and the node, wherein a gate of the first PFET is coupled to a gate of the second PFET.

13. The IC of claim 12, wherein the capacitor leakage-current compensation circuit further comprises an operational amplifier including a first input coupled to a first node between the first PFET and the replica n-channel MOS capacitor, a second input coupled to a reference voltage generator or the node, and an output coupled to the gates of the first and second PFETs.

14. The IC of claim 1, wherein the MOM capacitor stacked over the MOS capacitor is part of a capacitor bank including an array of MOM capacitors stacked over and coupled in parallel with an array of MOS capacitors between the first voltage rail and the node, respectively, wherein the array of MOS capacitors generate the leakage current while in operation.

15. An integrated circuit (IC), comprising:
a metal-oxide-semiconductor (MOS) capacitor coupled between a first voltage rail and a node, wherein the MOS capacitor generates a leakage current while in operation, the leakage current flowing between the first voltage rail and the node;
a capacitor leakage-current compensation circuit coupled between the node and a second voltage rail, wherein the capacitor leakage-current compensation circuit is configured to generate a compensation current flowing between the node and the second voltage rail, the compensation current flowing in the same direction as the leakage current between the first voltage rail and the second voltage rail; and
a digitally-controlled oscillator (DCO) comprising:
a current digital-to-analog converter (DAC);
a first field effect transistor (FET) coupled in series with the current DAC between the first voltage rail and the second voltage rail, wherein the first FET includes a gate and a drain coupled together;
a current-controlled oscillator (CCO);
a second FET coupled in series with the CCO between the first voltage rail and the second voltage rail; and
a resistor coupled between the gate of the first FET and a gate of the second FET.

16. The IC of claim 15, wherein a magnitude of the compensation current is related to a magnitude of the leakage current.

17. The IC of claim 15, wherein:
the first voltage rail comprises an upper voltage rail;
the second voltage rail comprises a lower voltage rail; and
the MOS capacitor comprises a p-channel MOS capacitor.

18. The IC of claim 17, wherein the capacitor leakage-current compensation circuit comprises:

a replica p-channel MOS capacitor configured to generate a replica leakage current; and a current mirror configured to generate the compensation current based on the replica leakage current.

19. The IC of claim 15, wherein:

the first voltage rail comprises a lower voltage rail;

the second voltage rail comprises an upper voltage rail; and the MOS capacitor comprises an n-channel MOS capacitor.

* * * * *